(12) United States Patent
Panther et al.

(10) Patent No.: US 9,806,423 B2
(45) Date of Patent: Oct. 31, 2017

(54) CAPACITIVELY COUPLED PATCH ANTENNA

(71) Applicant: TALLYSMAN WIRELESS INC., Ottawa (CA)

(72) Inventors: Gyles Panther, Ottawa (CA); Rony E. Amaya, Kanata (CA); James Stuart Wight, Ottawa (CA)

(*) Notice: Subject to any disclaimer, the term of this patent is extended or adjusted under 35 U.S.C. 154(b) by 77 days.

(21) Appl. No.: 14/389,682

(22) PCT Filed: Apr. 5, 2013

(86) PCT No.: PCT/CA2013/050275
§ 371 (c)(1),
(2) Date: Sep. 30, 2014

(87) PCT Pub. No.: WO2013/149347
PCT Pub. Date: Oct. 10, 2013

(65) Prior Publication Data
US 2015/0236424 A1    Aug. 20, 2015

Related U.S. Application Data

(60) Provisional application No. 61/620,665, filed on Apr. 5, 2012.

(51) Int. Cl.
| | | |
|---|---|---|
| *H01Q 9/04* | (2006.01) | |
| *H01Q 1/38* | (2006.01) | |
| *H03H 11/28* | (2006.01) | |

(52) U.S. Cl.
CPC ............. *H01Q 9/0435* (2013.01); *H01Q 1/38* (2013.01); *H03H 11/28* (2013.01)

(58) Field of Classification Search
CPC .......................... H01Q 9/0414; H01Q 21/065
See application file for complete search history.

(56) References Cited

U.S. PATENT DOCUMENTS

| | | | | |
|---|---|---|---|---|
| 4,660,048 A | * | 4/1987 | Doyle ................. | H01Q 9/0414 343/700 MS |
| 5,003,318 A | * | 3/1991 | Berneking ........... | H01Q 9/0414 343/700 MS |

(Continued)

FOREIGN PATENT DOCUMENTS

| | | |
|---|---|---|
| EP | 0188087 A1 | 7/1986 |
| EP | 1478051 A1 | 11/2004 |
| KR | 101025910 B1 | 3/2011 |

OTHER PUBLICATIONS

International Search Report of PCT/CA2013/050275.
(Continued)

*Primary Examiner* — Dameon E Levi
*Assistant Examiner* — David Lotter
(74) *Attorney, Agent, or Firm* — Brion Raffoul

(57) ABSTRACT

Systems and methods relating to patch antennas. A patch antenna has a substrate, a resonant metal plate at one side of the substrate, and a ground plane at the other opposite side of the substrate. Two feed pins are used to couple the antenna to other circuitry. The feed pins pass through the substrate and holes in at the ground plane. The feed pins are physically disconnected from both the resonant metal plate and the ground plane. The feed pins are capacitively coupled to the resonant metal plate to provide an electronic connection between other circuitry and the patch antenna.

15 Claims, 17 Drawing Sheets

(56) References Cited

U.S. PATENT DOCUMENTS

| | | |
|---|---|---|
| 5,006,859 A | 4/1991 | Wong et al. |
| 5,708,444 A | 1/1998 | Pouwels et al. |
| 7,298,329 B2 * | 11/2007 | Diament ............... H01Q 1/523 343/700 MS |
| 2004/0227670 A1 * | 11/2004 | Higasa ................ H01Q 9/0435 343/700 MS |
| 2005/0190106 A1 * | 9/2005 | Anguera Pros ......... H01Q 1/36 343/700 MS |
| 2008/0266179 A1 * | 10/2008 | Sotoudeh .............. H01Q 1/243 343/700 MS |
| 2009/0274072 A1 | 11/2009 | Knox |
| 2012/0243580 A1 | 9/2012 | Wright |

OTHER PUBLICATIONS

Mayhew-Ridgers, G. "Development and modelling of new wideband microstrip patch antennas with capacitive feed probes", Thesis, University of Pretoria, 2004.
Examiners Report for Great Britain Patent Application No. 1419314.8 issued on Sep. 7, 2016.

* cited by examiner

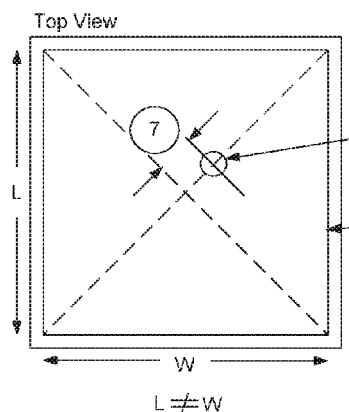
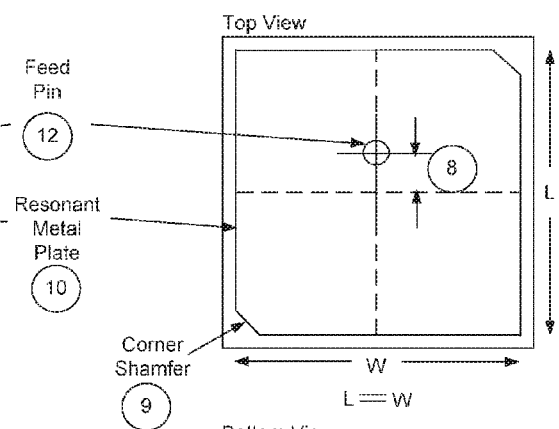
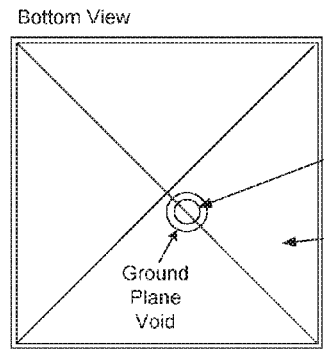
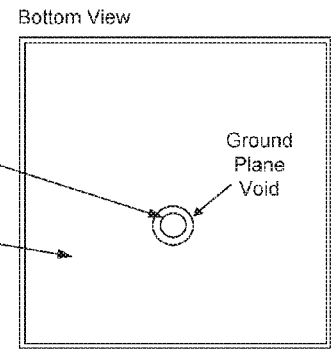
Figure 3(a) and 3(b)
- Prior Art -

- Prior Art -

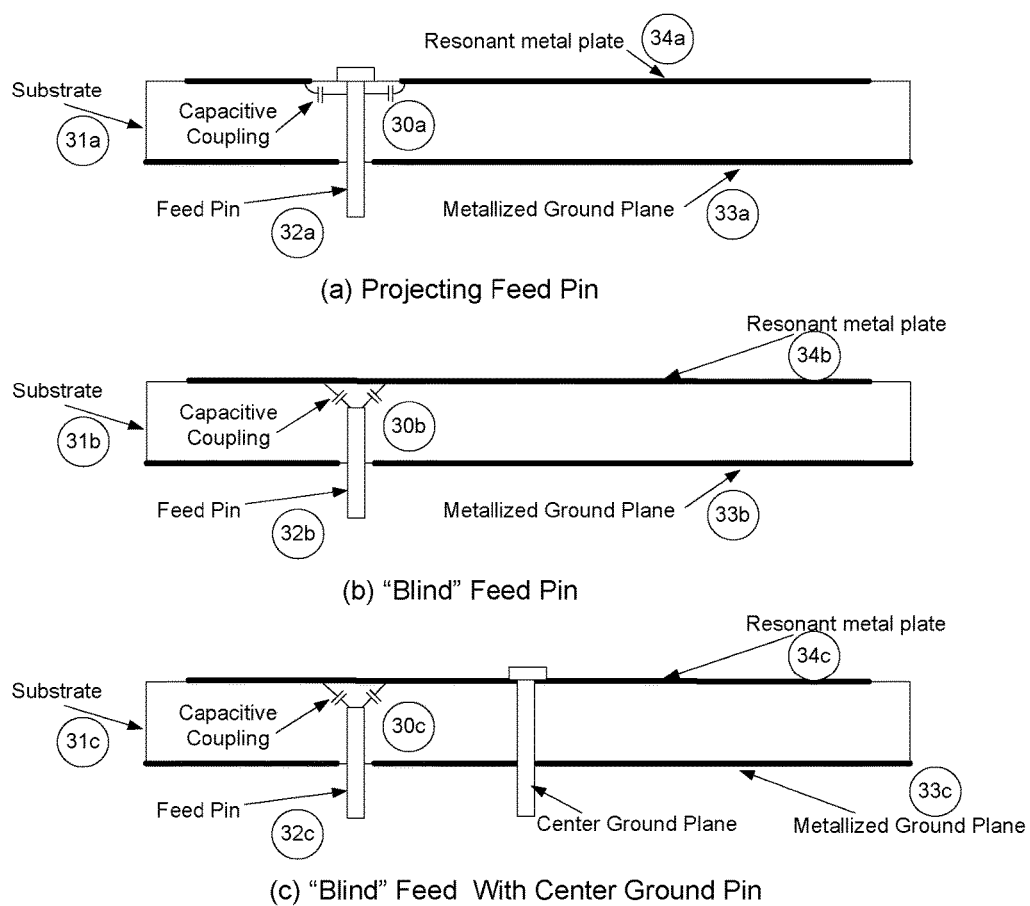
Figure 8(a), 8(b), and 8(c)

CAPACITIVELY COUPLED PATCH ANTENNA

TECHNICAL FIELD

The present invention relates to antennas. More specifically, the present invention relates to a patch antenna configuration that uses capacitive coupling to electronically couple to other circuit elements.

BACKGROUND OF THE INVENTION

Patch antennas are the work-horse antenna for receipt of L-band signals broadcast from satellites. These signals include Global Navigation Satellite Systems (GNSS) and other communications systems such as Globalstar, Iridium and a host of other L-Band satellite communications systems such as Inmarsat.

The civilian signals transmitted from GNSS satellites are right hand circularly polarized (RHCP). Circularly Polarized (CP) signals have the advantages that the received signal level is independent of the rotation of a CP receiving antenna in a plane orthogonal to the propagation vector.

Conceptually, circularly polarized signals can be thought of as comprised of two orthogonal, linearly polarized signals offset in phase by 90 degrees ("in phase quadrature"), as shown in FIG. 1.

When a circularly polarized wave is reflected at a low impedance surface (such as metallized glass), the polarization direction becomes reversed or "cross polarized", so that a RHCP wave becomes LHCP and vice versa. Multipath interference can cause pure CP waves to become instantaneously elliptical (i.e. tending toward linear polarization) when the 'direct', RHCP wave is combined with a 'reflected' LHCP wave.

A receiving antenna with a "pure" CP response has the property that cross polarised signals are strongly rejected (−20 dB or better), significantly reducing the response to reflected signals, while reception of the direct signal is unaffected.

Considerably better positioning accuracy can be obtained in GNSS systems that have antennas with a "pure" CP response.

It has been shown that GNSS receivers with the capability to track satellites from more than one constellation are able to offer considerably improved positioning, primarily because of the larger number of satellites that can be simultaneously tracked ("in view").

As a consequence almost all new GNSS receiver chips now in development, as at the date of this application, are designed to receive signals from multiple constellations.

While all GNSS constellations broadcast navigation signals on multiple frequencies, this disclosure is concerned primarily with those broadcast in the "L" band. The GNSS constellations in service, or planned, are as set out below:

U.S: GPS-L1: 1575.42 MHz (in service)
Russian Federation: GLONASS-L1: 1602 MHz (+13, −7)*0.5625 MHz (in service)
People's Republic of China: COMPASS-L1: 1561 MHz (being deployed).
Europe: Galileo L1: 1575.42 MHz (overlay on the US GPS frequencies, planned).

Patch Antenna Types

The most widely used antenna element for reception of GPS L1 signals has been single feed ceramic patches, see FIG. 2.

Typically, such antennas are comprised of a rectangular block of low loss, high dielectric substrate material (1) such as ceramic, typically 25 mm×25 mm×4 mm or smaller. A first major surface is metalized as a ground plane (2), and a resonant metal plate is metalized on the second major surface (3). The feed pin (4) is connected to the resonant metal plate and isolated from ground, passing through an aperture in the ground plane.

This structure constitutes two orthogonal high-Q resonant cavities, one along a first major axis (5) and another along the second major axis (6) of the patch.

There are a number of well-known techniques commonly used to elicit a CP response from a single feed patch element. Two widely utilized techniques are shown in FIG. 3(a) and FIG. 3(b), wherein the feed pin (12(a)) and (12(b)) is connected to a resonant plate (10(a)) and (10(b)), having corner chamfers (9) and/or small dimensional offsets, each associated with specific feed pin locations (7), (8).

The patch is electromagnetically coupled to free space by the fringing fields between the resonant metal plate (10) and ground plane (11).

Small single feed antennas with this structure are characterized by low cost, narrow bandwidth, and a "pure" CP response at a single frequency.

Such antennas are ideal for low cost GPS receivers because the GPS L1 signal is a single frequency carrier, direct sequence modulated with the navigation and spreading signals.

The nature of a circular E-M wave inherently suggests that a circularly polarized antenna can be realized with two linearly polarized antennas that are disposed orthogonally, with summing means to combine the signals present on the two feed pins in phase quadrature.

Such a structure is achieved with a dual feed patch antenna (see FIG. 4). This, more general architecture also utilizes a substrate (12) with a ground plane (13) on first side and a square resonant metal plate on the second side (14), but has two feed pins (15) (16), connected to the resonant metal plate, each isolated from the metallized ground plane. The feed pins are equally offset from the patch center and located so that the angle subtended between two lines drawn from each feed pin location to the patch centre is 90 degrees.

Typically, but not necessarily, the feed pin positions are located on the major 'X' axis (17) and 'Y' axes (18) in the plane of the patch.

In this configuration the antenna provides two orthogonal linear antennas. At all frequencies, there is a high degree of electrical isolation between the two feed pins.

If the signals which are in phase quadrature and which are present at the feed pins, are combined in phase quadrature, the response of the antenna will either be LHCP or RHCP depending upon the polarity of the phase offset of the Q (quadrature) signal phase relative to that of the I (In-phase) signal.

Two alternate combining networks are shown in FIG. 5(a) and FIG. 5(b). With reference to FIG. 5(a) the function of a combining network can most readily be understood in terms of summing device (19), with isolated ports (such as a Wilkinson combiner), having a 90 degree phase shift in one branch (20) (such as a λ/4 transmission line), connected between a first antenna feed (21) and a first input (22) of the summing network (19), with the second antenna feed (23) connected directly to the second input to a summing device. FIG. 5(b) shows another form of quadrature combining network that utilizes a 90 degree hybrid, a device that has precisely the required transfer function.

Dual feed antennas (including variants with aperture coupled feeds) are characterized by a narrow bandwidth, but have a "mathematically correct" response. This provides a "pure" CP response over the entire bandwidth of the antenna. The requirement for a hybrid combiner makes the dual feed architecture somewhat more costly than single feed.

Relative Characteristics of Patch Antennas

The axial ratio ("AR") parameter for a CP antenna is a measure of the maximum to minimum response to a linearly polarized wave propagating in a plane orthogonal to a line to the antenna center.

The frequency response of a single feed patch to linearly polarized excitation is a function of the field rotation relative to the receiving antenna. This effectively reveals the axial ratio. In FIG. 6, curves A and B show that the axial ratio for a typical 25 mm×25 mm×4 mm single feed patch at GPS and GLONASS frequencies is about 8 dB for certain rotation angles of the linear field (shown at Zenith).

This shows that, by its nature, a single feed patch element exhibits a truly circular response (AR=0 dB) only where the curves for all rotation angles intercept, i.e. at a single frequency. The corollary is that at the 1 dB bandwidth corner frequencies, the response is strongly elliptical.

Well-tuned single feed patch antennas are ideal for GPS because GPS L1 navigation signals are DSS modulated single frequency carriers. However reception of multiple constellation signals requires antennas to operate over an extended bandwidth.

In urban regions GNSS signals are commonly reflected from buildings so that a delayed, cross-polarized signal is superimposed on the direct signal. The effect of poor axial ratio in a receiving antenna is that the cross polarized signals are not strongly rejected by the antenna so that the signals input to a GNSS receiver are "smeared". They are also subject to "flutter" for individual satellite signals due to cross-polarization interference (standing wave) effects.

Dual feed patch antennas theoretically can exhibit a virtually ideal axial ratio (AR=0 dB) over the entire bandwidth of the patch. This is because each axis is isolated from the other and, at higher elevation angles, both receive equal amplitudes for an incident CP wave, and contribute equally. Thus, dual feed antennas offer considerably improved performance for multi-constellation reception.

The feed impedance of a single feed patch (See FIG. 2) is a strong function of the offset distance of the feed pin from the patch center. At the resonant frequency, with the feed pin at dead centre of the patch, the feed impedance is a short circuit to ground, and a high impedance with the feed pin offset close to the edge the resonant metal patch.

For a 4 mm×25 mm×25 mm patch, the feed impedance is approximately 50 Ohms with the feed pin offset by approximately 2 mm from the patch centre. To minimise feed inductance, the physical feed pin diameter is typically about 1.5 mm diameter. Thus, the dimensions in a small patch element are too small to accommodate dual feed pins with a convenient feed impedance.

Given sufficient radio frequency ("RF") gain, the limitation to sensitivity of a GNSS receiver comprised of an antenna and a receiving circuit, is the ratio of the received signal carrier power to the total system noise, commonly referred to the antenna terminals, in a one Hertz bandwidth ("C/No")

Total system noise is at least the sum of galactic noise, local black-body radiation, man-made noise, noise generated in the receiver, plus effective noise generated as a function of losses in the antenna.

As is known, it is important to provide an optimum noise match (impedance) between the antenna and the first RF amplifier stage (known as "Topt"). Thus it is also important that the feed impedance of the antenna have a value that is an optimum noise match to the first RF amplifier stage, requiring a minimum of additional matching components.

Small single feed patch elements can be configured to provide a convenient (50 Ohm) real impedance but only at a single frequency.

From the aforesaid, it will be appreciated that single feed antennas are considerably deficient for reception of multiple constellation GNSS signals and it is not feasible to realized a more appropriate dual feed patch according to prior art on a small high dielectric substrate.

Furthermore, the dual feed antenna has a requirement for a signal combining network. All known combining network are relatively large compared with the dimensions of a miniaturized antenna, and all represent additional cost. There is therefore a need for a means to achieve the same combining function using smaller less expensive components.

SUMMARY OF INVENTION

The present invention provides systems and methods relating to patch antennas. A patch antenna has a substrate, a resonant metal plate at one side of the substrate, and a ground plane at the other opposite side of the substrate. Two feed pins are used to couple the antenna to other circuitry. The feed pins pass through the substrate and holes in at the ground plane. The feed pins are physically disconnected from both the resonant metal plate and the ground plane. The feed pins are capacitively coupled to the resonant metal plate to provide an electronic connection between other circuitry and the patch antenna.

The present invention also provides a circuit with discrete resistors, capacitors, inductors and amplifiers arrayed in an arrangement with 2 input ports and one output port. The circuit provides a high degree of reverse electrical isolation between the input ports and the output at the radio frequency. The circuit provides an output that is the vector sum of signals in present at the first and second input ports. The circuit additionally provides for introduction of a 90 degree phase shift into either of the two inputs.

In a first aspect, the present invention provides a patch antenna element comprising,
 a resonant metal plate;
 a ground plate;
 a dielectric substrate sandwiched between said resonant metal plate and said ground plate;
 at least two feed pins for electrically coupling said antenna element with further circuitry;
wherein
 each of said at least two feed pins is located in said substrate;
 each of said at least two feed pins protrudes through a hole in said ground plane, said at least two feed pins being physically unconnected to said ground plane;
 none of said at least two feed pins is physically connected to said resonant metal plate.

In a second aspect, the present invention provides a patch antenna element comprising,
 a resonant metal plate;
 a ground plate;
 a dielectric substrate sandwiched between said resonant metal plate and said ground plate;

a plurality of pairs of feed pins for electrically coupling said antenna element with further circuitry;
wherein
each of said pairs of feed pins is located in said substrate;
each of said pairs of feed pins protrudes through a hole in said ground plane, each of said pairs of feed pins being physically unconnected to said ground plane;
none of said plurality of pairs of feed pins is physically connected to said resonant metal plate.

In a second aspect, the present invention provides a circuit for use in combining signals in phase quadrature for a circularly polarized patch antenna, the circuit comprising:
a first amplifier receiving a first signal feed and having a first amplifier output;
a second amplifier receiving a second signal feed and having a second amplifier output;
a common combining node;
a capacitor coupled between said first amplifier output and said common combining node;
an inductor coupled between said second amplifier output and said common combining node;
wherein said first and second amplifiers are matched amplifiers.

BRIEF DESCRIPTION OF THE DRAWINGS

The embodiments of the present invention will now be described by reference to the following Figures, in which identical reference numerals in different Figures indicate identical elements and in which:

FIG. 3(a) and FIG. 3(b) show two means of eliciting a CP response from a single feed patch antennas;

FIGS. 8(a) and 8(b) show cross-sectional details of the patch antennas in shown in FIGS. 7(a) and 7(b);

FIG. 8(c) shows cross-sectional details of the patch antenna shown in FIG. 7(b) having a center ground pin.

DETAILED DESCRIPTION OF THE INVENTION

Figure 1:
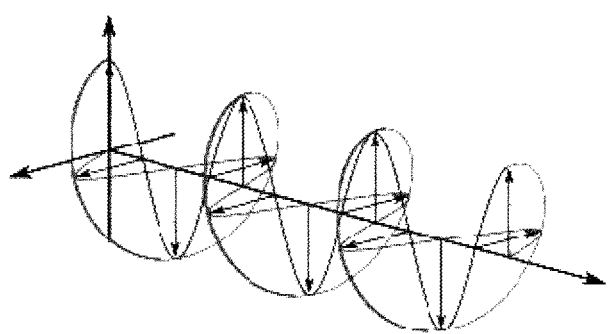
FIG. 1 is a graphic representation of a circularly polarized wave.

The invention may take the form of a number of embodiments while still conforming to the general inventive concept detailed by the description below.

It should be noted that, for this document, the term "metallized patch" is to be taken as being synonymous to the term "resonant metal plate".

One embodiment of the invention is a patch antenna that is electrically small relative to the wavelength of the intended operational frequency. The antenna has at least two feed pins which provide electrical coupling to the antenna for the reception or transmission of a signal. The feed pins pass through the patch substrate and through defined openings in each of a resonant metal plate and a metallized ground plane without a direct physical connection to either. The feed pin locations are conveniently offset from the centre of the patch element, and with a capacitive reactance between the feed pins and the resonant metal plate that may be varied by the mechanical configuration. The pins simultaneously provide a coupling means for electrical connection to the antenna and to an integrated matching network that can be configured so as to provide a convenient controlled impedance (e.g. as 50 ohms) at the antenna feed pins.

Another embodiment of the invention provides a patch antenna that has two capacitively coupled feed pins located on the patch such that the angle between two lines drawn between the feed pins and the patch centre is 90 degrees. This disposition of the pins provides electrical isolation between the two feed pins at the resonant frequency of the patch. The feed pins offset from the patch center present a controlled output impedance (e.g. 50 ohms).

A further embodiment of the invention provides a patch antenna with two feed pins, each capacitively coupled to orthogonal axes of the antenna. The feed pins are connected to a two port summing network for summing the signals present at the two feed pins in-phase quadrature to form an antenna with a circularly polarized transmit or receive response. The rotational direction is determined by the phase polarity of the quadrature summing network. The feed pins are offset from the patch center so as to present a controlled output impedance (e.g. 50 ohms).

Another embodiment of the invention provides a patch antenna which has a square shaped metallized patch with one or more feed pins that are capacitively coupled to the metallized patch. This provides an electrical means for coupling to the antenna to receive or transmit a signal. The mechanical configuration of the antenna and the feed pins realizes an integrated matching network that can be dimensioned so as to provide a convenient controlled output impedance (e.g. 50 ohms) without a requirement for external matching components.

Another embodiment of the invention provides a patch antenna which has an octagonal shaped metallized patch with at least two feed pins, offset from the patch center and located on orthogonal lines drawn between the pins and the patch center, each feed pin being capacitively coupled to the metallized patch, said feed pins being unconnected to either the metallized patch or the ground plane, with additional balancing voids disposed in symmetrical opposition to the feed pins, with respect to the patch centre.

Another embodiment of the invention provides a patch antenna with a metallized patch with at least two feed pins, offset from the patch center and located on orthogonal lines drawn between the pins and the patch center, each feed pin being capacitively coupled to the metallized patch, said feed pins being unconnected to either the metallized patch or the ground plane, with a center grounding pin connected to the metallized patch at its center, and to the metallized ground plane or circuit ground, as may be mechanically convenient.

Yet a further embodiment of the invention provides a patch antenna with one or more feed pins that pass through the patch substrate and through defined openings in a metallized patch and in a metallized ground plane without a direct physical connection to either. This has a precisely controlled configuration relative to the substrate, such as an interference fit between the pins and the substrate material so as to exclude most of the air from the interface between the pin and the substrate. This also provides for controlled capacitance from the metallized patch and the patch ground plane to each of the feed pins.

A further aspect of the invention provides a patch antenna with two capacitively coupled feed pins located on the principal orthogonal axes in the plane of a larger patch surface. This provides for electrical trimming of the resonant frequency of each principal axis of the patch independently of the other by cutting small notches in the metallized patch edges or by the removal of metallized patch along its edges.

Another aspect of the invention relates to a novel patch antenna structure where a feed pin is provided for the purpose of electrically coupling a patch antenna to a receiving device. The coupling is realized by means of a capacitive reactance between the feed pin and the metallized patch on the antenna.

Figure 2:
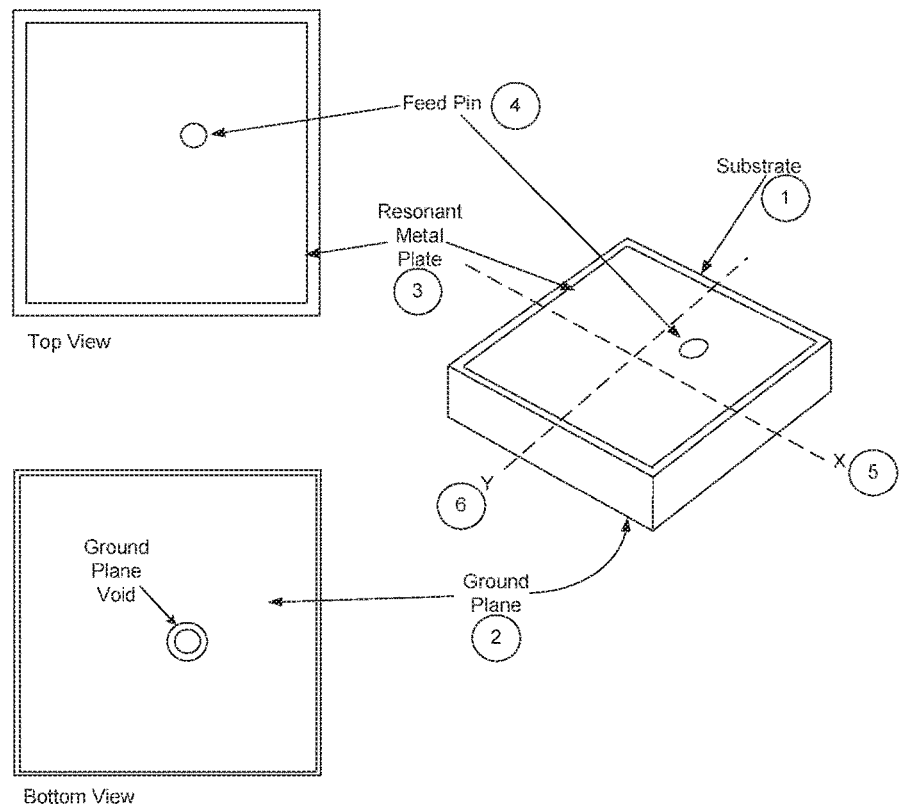
FIG. 2 shows a single feed directly connected patch antenna element according to the prior art.
Figure 4:
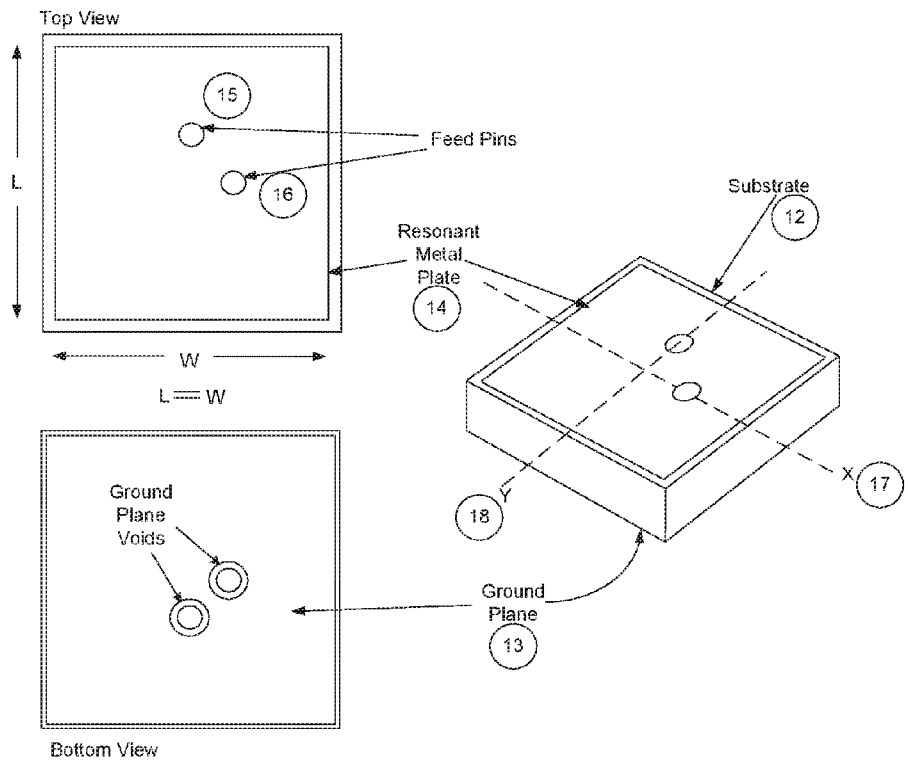
FIG. 4 illustrates a directly connected dual feed patch, according to prior art.

According to prior art, most small patch antennas have a feed pin for coupling the antenna to a receiving circuit, where the feed pin passes through a insulating low loss substrate and through an opening in the ground plane with the feed pin not being physically connected to the ground plane. Such patch antennas have a resonant metal plate directly connected to the feed pin (see FIG. 2). The antenna feed impedance is determined by the offset between the feed pin and the patch centre, so that the required feed impedance is fully determined by the feed pin location. The required feed impedance is 50 Ohms (real), corresponding to a typical feed pin offset of approximately 2 mm.

According the invention disclosed herein, the at least two feed pins of the capacitively coupled patch antenna pass through a low loss insulating substrate and through an opening in the ground plane without a direct physical connection to the ground plane. The at least two feed pins may extend to a height in the substrate that may extend to and protrude from the upper surface of the patch antenna, with the resonant metal plate configured to prevent any direct physical connection between the plate and the feed pins (see FIGS. 12, 13 and 14). If the feed pin protrudes through the upper surface, an opening in the resonant metal plate is provided to avoid direct connection between the metal plate and the feed pin. If the height of the at least two feed pins is less than the thickness of the substrate, such as in a "blind" hole, the resonant metal plate may be continuous over the feed pins (i.e. no holes in the plate), and the plate is not directly connected to the feed pin. The capacitive reactance between the feed pins and the plate can be varied through the mechanical design of the plate and the ceramic substrate and the height of the feed pins.

According to another aspect of the invention, the at least two feed pins may extent through the substrate and be connected to small metal islands that are co-planar with the metal plate but isolated from it at DC by voids surrounding the metal islands. A capacitive reactance is created between the metal islands and the metal plate and this reactance can be varied through mechanical design of the metal plate and the metal islands.

Figures 7A, 7B:
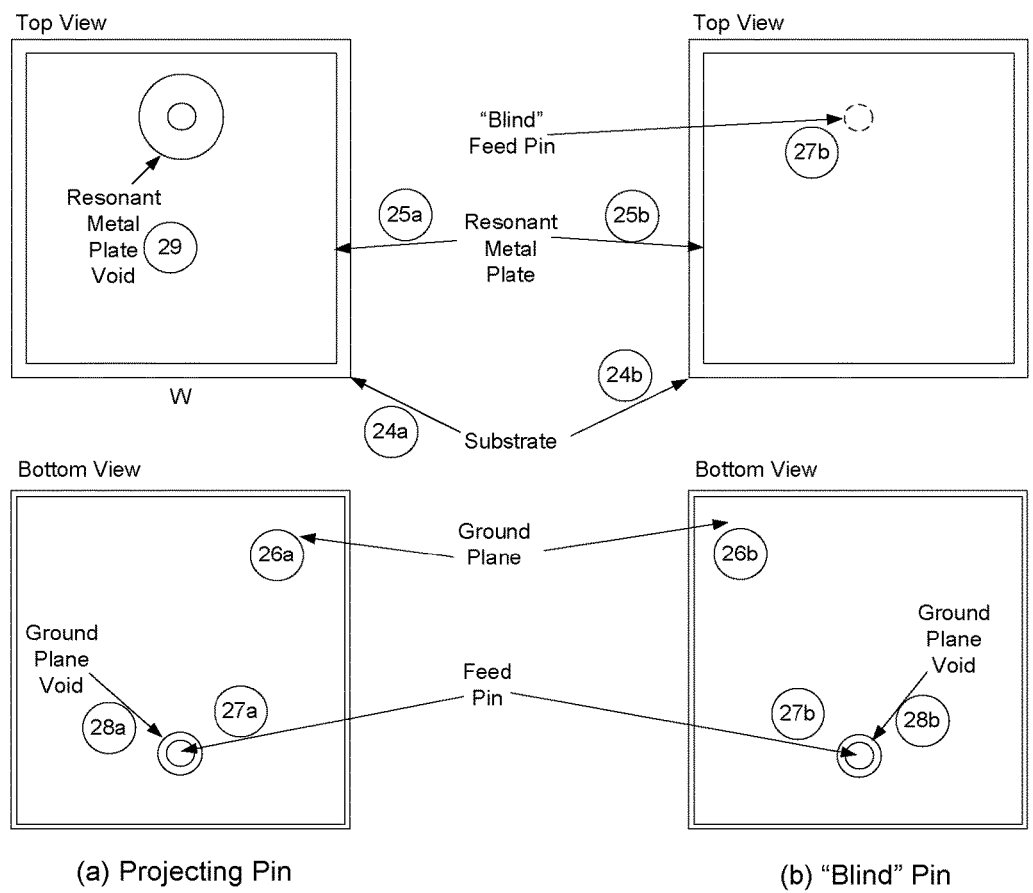
FIGS. 7(a) and 7(b) illustrate single feed patch antennas with capacitively coupled feed pins according to one aspect of the invention.

FIGS. 7a and 7b show two forms of capacitively coupled single feed antennas. Both of these antennas have substrates 24(a) and 24(b), respectively, with ground planes on a first side (26(a) and 26(b), respectively), and resonant metal plates on the second (25(a) and 25(b), respectively).

In FIG. 7a, the feed pin (27(a)) protrudes through the substrate but is DC isolated from the ground plane 26(a) by a ground plane aperture (28(a)), and isolated from the resonant metal plate by a void around the feed pin (29). Capacitive coupling is thus created laterally within the substrate between the feed pin and the metal plate.

In FIG. 7(b) the feed pin 27(b) is also isolated from the ground plane 26(b) by a ground plane aperture 28(b). The feed pin is contained in a blind hole that does not extend through the full thickness of the substrate. Capacitive coupling is thus created within the substrate between the top of the feed pin and the resonant metal plate.

FIGS. 8(a) and 8(b) show cross sections of the capacitive coupling schemes illustrated in FIGS. 7(a) and 7(b) respectively. In both cases, the feed pins (32(a)) and (32(b)) pass through the metallized ground plane (33(a)) and (33(b)), respectively, and are not connected to it.

FIG. 8(a) shows the feed pins protruding through the substrate (31(a)) without any physical contact between the feed pin and the resonant metal plate (34(a)).

FIG. 8(b) shows the feed pin in a "blind" hole, not protruding through the resonant metal plate (34(b)).

In both instances, capacitive coupling (30(a) and 30(b), respectively) is formed between the feed pin and the resonant metal plate without any physical contact.

FIG. 8(c) shows the cross section of the structure of FIG. 7(b) with the addition of a ground pin that is connected to the resonant metal plate at its center point, being an RF ground node, for connection to the ground plane or to a circuit ground node, as may be electrically or mechanically convenient.

Figure 9:
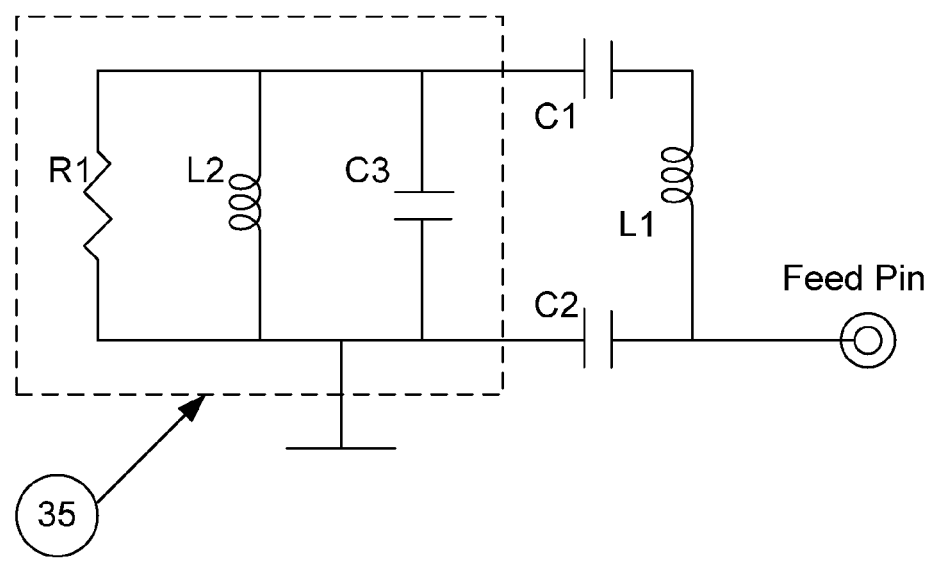
FIG. 9 is a simplified equivalent circuit of a capacitively coupled patch antenna.

A simplified equivalent circuit of one of two orthogonal cavity resonators of a patch is shown in FIG. 9. Within the dotted box (35) R1 represents the radiation resistance of one patch axis which, together with the parallel combination of L2 and C3, represent a simplified resonant cavity with an unloaded Quality factor, Qp, given by $$Qp=2*\pi*F*L2/R1$$

The capacitance C1 represents the capacitive reactance between each one of the at least two feed pins and the resonant metal plate, and L1 represents the series self-inductance of each feed pin. The inductive reactance of the feed pins is small compared with the reactance of C1 so that the net reactance is capacitive. C2 represents the capacitive reactance that exists between each one of the at least two feed pins and the metallized ground plane.

By virtue of the low loss nature of the ceramic substrate, the quality factor ("Qc") of the capacitance C1 is very high.

Capacitance C1 also forms one element of an "L" matching network ("L-match") that transforms the patch impedance as manifest in the region of the feed pin to a lower controlled impedance, such as 50 Ohms. The L-match network is widely used in radio frequency design.

Figure 10:
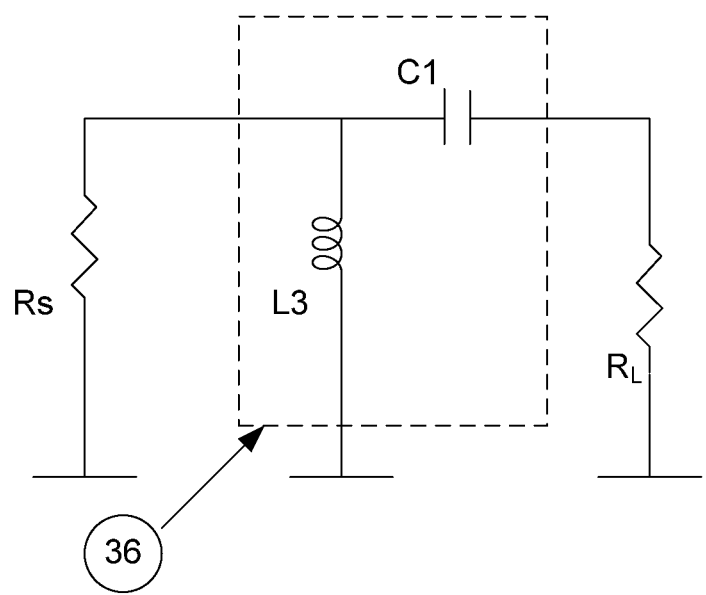
FIG. 10 is a schematic representation of an exemplary L-match impedance matching network.

An exemplary L match network is shown within the dotted box (36) in FIG. 10. A first shunt reactance (L3) is connected across the (higher) resistance $R_s$, and a second reactance (C4) is connected in series with the (lower) resistance $R_L$.

Figure 11:
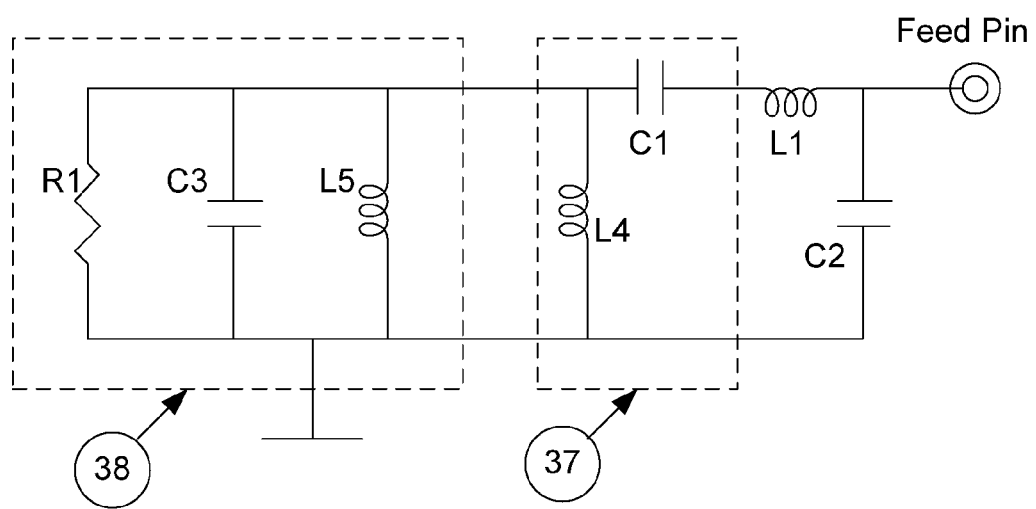
FIG. 11 shows the integrated L-match in a capacitively coupled patch antenna.

The circuit of FIG. 9 can be re-drawn as in FIG. 11, and, in so doing, the shunt resonator inductance component of the cavity resonator (L2), may be considered as two "virtual" components, L4 and L5, such that the reactance of the parallel combination of L4 and L5 is equal to that of L2 in FIG. 9. The feed capacitance C1 and "virtual" inductance L4 constitute an L-match network (shown in a dotted box (37)) that transforms the higher impedance of the resonant metal plate in the region of one of the at least two feed pins, to a lower controlled impedance (50 Ohms). The contributions of L1 and C2 may be neglected for the purpose of this explanation. The equivalent cavity resonator is shown in a second dotted box (38). The "virtual" resonator reactance of L4 is larger than that of L2 in FIG. 9, so that the effect of the capacitive coupling is to shift the resonant frequency down.

By this means the antenna is coupled to the external receiving circuit. Thus C1, being the capacitive reactance between each one of the feed pins and the resonant metal plate, couples the feed pins to the resonant metal plate and also provides an impedance transformation to present a controlled impedance at the feed pins (50 ohms, real).

By this means, a dual feed patch antenna is made feasible by the capacitively coupled feeds for small substrates, such as a 25 mm square substrate, because the integrated L-match enables each of the at least two pins to be located at a mechanically convenient offset from the patch center.

Figure 12:
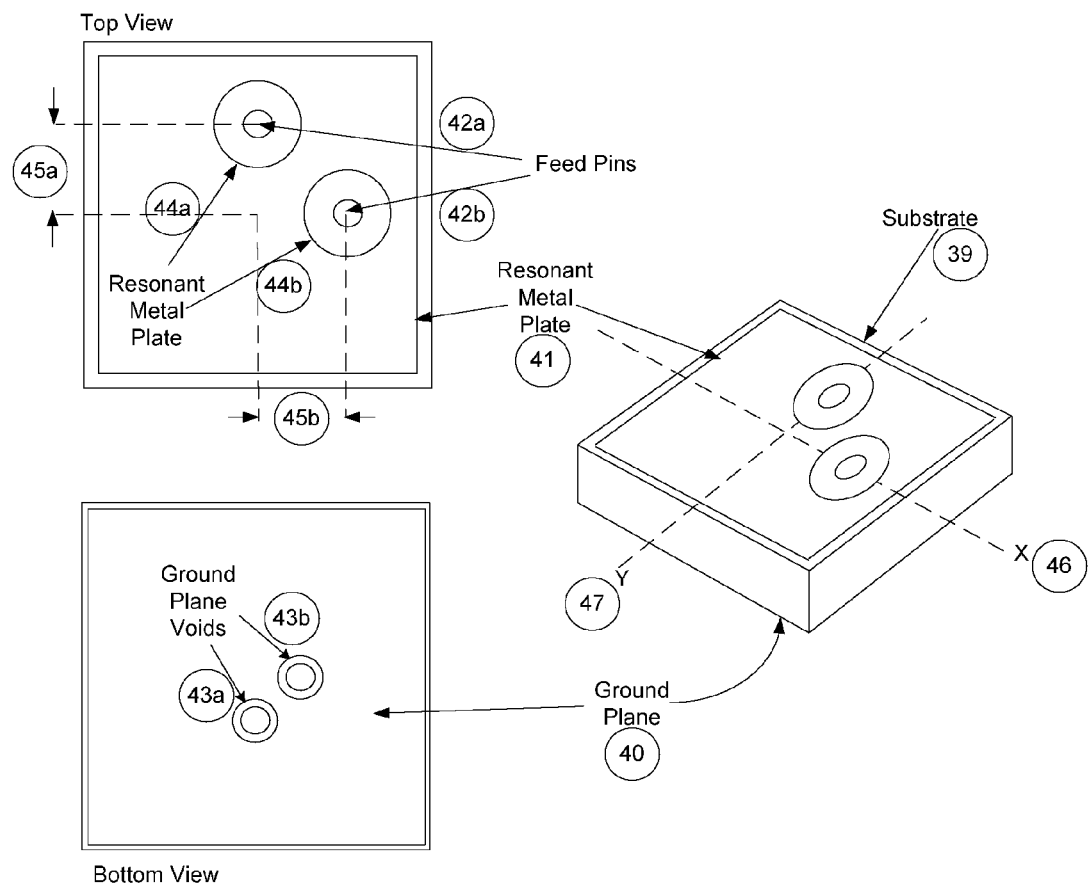
FIG. 12 shows a dual feed capacitively coupled patch antenna according to the present invention.

A dual feed capacitively coupled patch antenna, shown in FIG. 12, is comprised of a substrate (39) with a first major surface metallized with a ground plane (40) and a second major surface metallized with a resonant metal plate (41). Two feed pins (42(a)) and (42(b)) protrude through holes in the substrate and are physically isolated from the ground plane by apertures in the ground plane (43(a)) and (43(b)) and from the resonant metal plate by metal voids in the resonant metal plate (44(a)) and (44(b)). The feed pins are disposed at convenient and equal distances (45(a)) and (45(b)) from the patch center on the two major axis of the patch (46) and (47).

A capacitive impedance is formed between each one of the two feed pins and the resonant metal plate that may be varied and determined by the mechanical dimensions of the feed pins and the resonant metal plate.

In each case, the resonant metal plate is coupled to each of the feed pins by the capacitive reactance between the metal plate and each one of the feed pins.

The illustrations show the feed pins being disposed equidistantly from the patch center on the major axes of the patch. However, for convenience, the axis of the feed pins may be rotated relative to the major axis of the resonant plate, with equal effect.

In some antenna configurations it is desirable to provide the antenna output at a central location on the bottom surface of the antenna housing. In contrast to the current state of the art feed configurations, a capacitively coupled feed allows the feed pin location to be offset from the patch center to facilitate the positioning of the antenna output connector beneath the centre of the patch on the bottom of the antenna housing while maintaining the physical separation between the antenna feed (LNA input) and the antenna output (LNA output).

The ability to increase the offset of the feed pin from the patch center by means of the impedance matching properties of the capacitive feed make it feasible to realize a dual feed structure using a small patch (25 mm square substrate of varying thickness).

The capacitively coupled patch shown in FIG. 12 has voids in the resonant metal plate that provide DC isolation between the feed pins and the metal plate. This structure is asymmetric relative to any orthogonal axis pair of the antenna, resulting in small variations in the resonant frequency as a function of the rotation angle of a linearly polarized wave in a plane orthogonal to a line drawn to the center of the capacitively coupled patch antenna.

Figure 13:
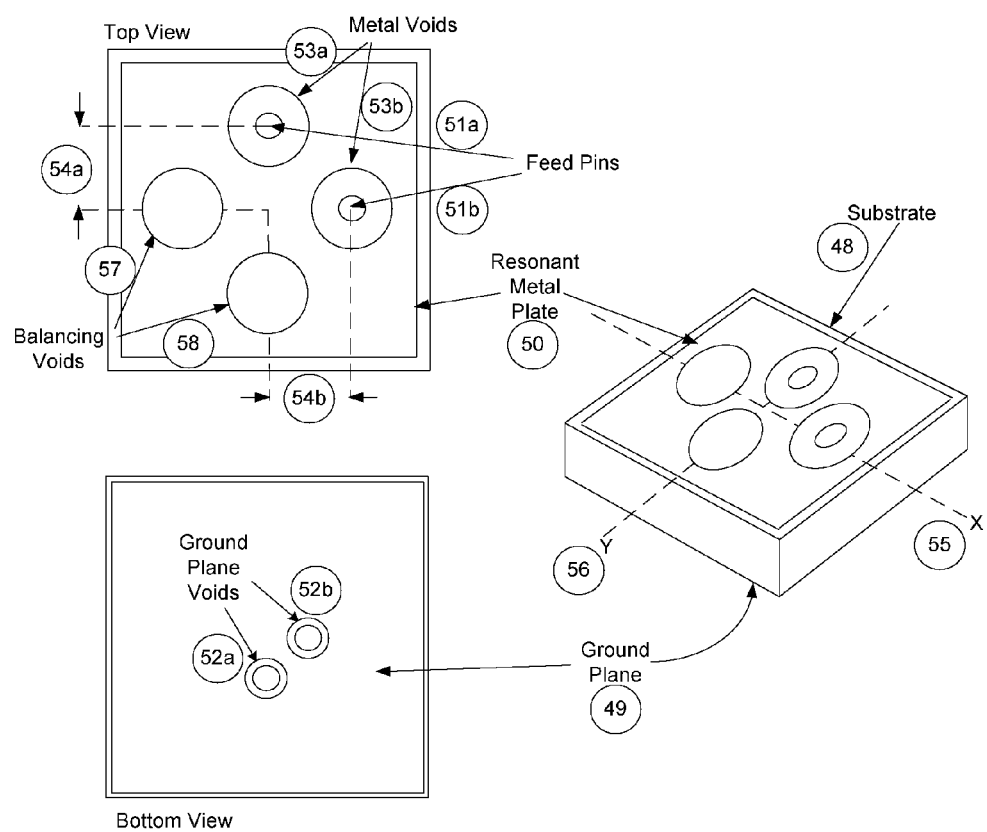
FIG. 13 shows a dual feed capacitively coupled antenna with additional balancing voids according to another aspect of the present invention.

An improved structure for a capacitively coupled patch antenna is shown in FIG. 13, comprised of a substrate (48) with a first major surface metallized with a ground plane (49) and a second major surface metallized with a resonant metal plate (50). Two feed pins (51(a)) and (51(b)) protrude through holes in the substrate and are physically isolated from the ground plane by apertures in the ground plane (52(a)) and (52(b)) and from the resonant metal plate by metal voids in the resonant metal plate (53(a)) and (53(b)). The feed pins are disposed at convenient and equal distances (54(a)) and (54(b)) from the patch center on the two major axis of the patch (55) and (56), with additional balancing voids (57) and (58) disposed at symmetrically opposed locations in the resonant metal plate, relative to its center. The balancing voids are similar or equal in dimensions to the voids in the metal plate surrounding the feed pins or feed islands.

The additional balancing voids introduce rotational symmetry that results in an invariant resonant frequency that is independent of the rotation of a linearly polarized excitation wave, and also provides a more accurate phase response.

The capacitive impedance that is formed between each one of the at least two feed pins and the resonant metal plate serve to couple the antenna of FIG. 13 to other circuits for reception of transmission of circularly polarized signals.

To simplify the teaching of this document, this discussion has been with reference to square resonant metal plates. However, patch antennas can be realized using resonant metal plates of different shapes, such as circular, octagonal and other geometric configurations, including such shapes with radiused apexes.

Figure 14:
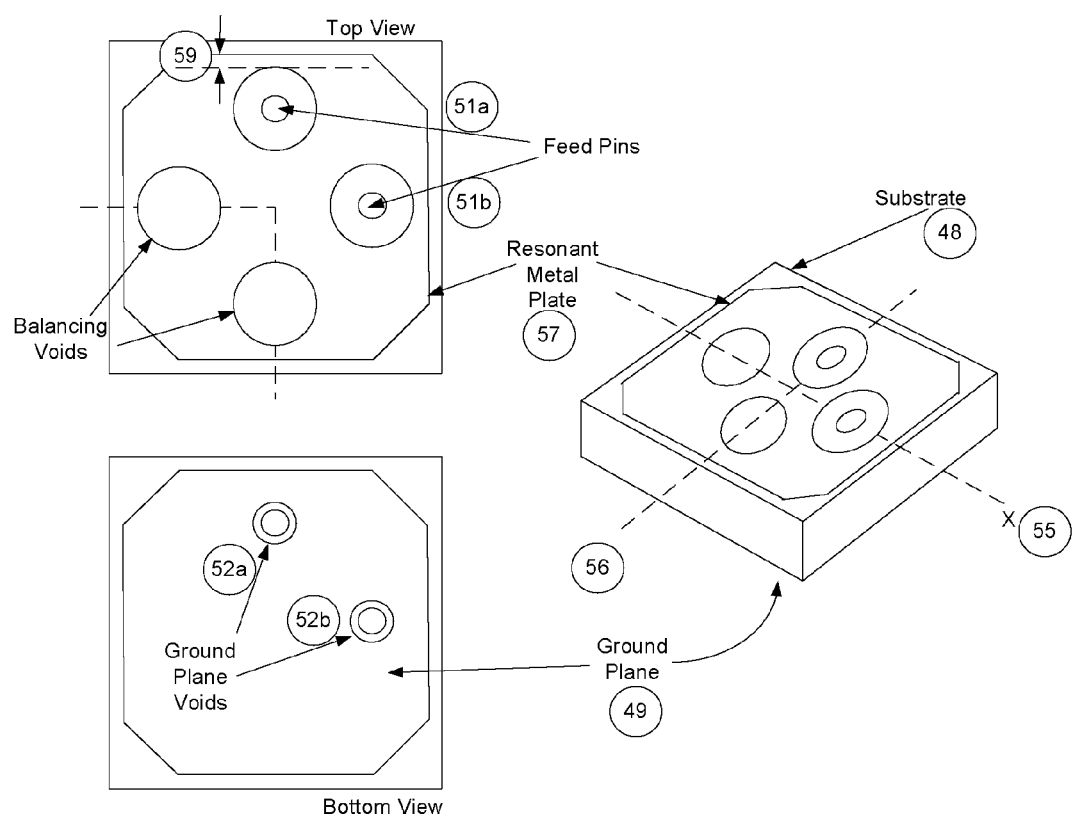
FIG. 14 shows a dual feed capacitive couple antenna with an octagonal resonant plate, with balancing voids according to another aspect of the present invention.

A further improved structure for a capacitively coupled patch is shown in FIG. 14. In this embodiment, a rectangular substrate has a metallized ground plane on a first major side and a resonant metal plate on the second major side. The resonant metal plate (57) has an octagonal shape. As an alternative, the resonant metal plate may have a non-equilateral shape so as to allow a larger clearance between the void edges and the edges of the resonant metal plate (59). As in FIG. 13, the feed pins are balanced by additional balancing metal voids in the resonant metal plate.

In a further improvement on a capacitively coupled patch, each feed signal may be converted to a balanced signal pair (antipodal) to drive feed pin pairs on each of two major axes of the patch, so as to realize a quad feed capacitively coupled patch.

Figure 15:
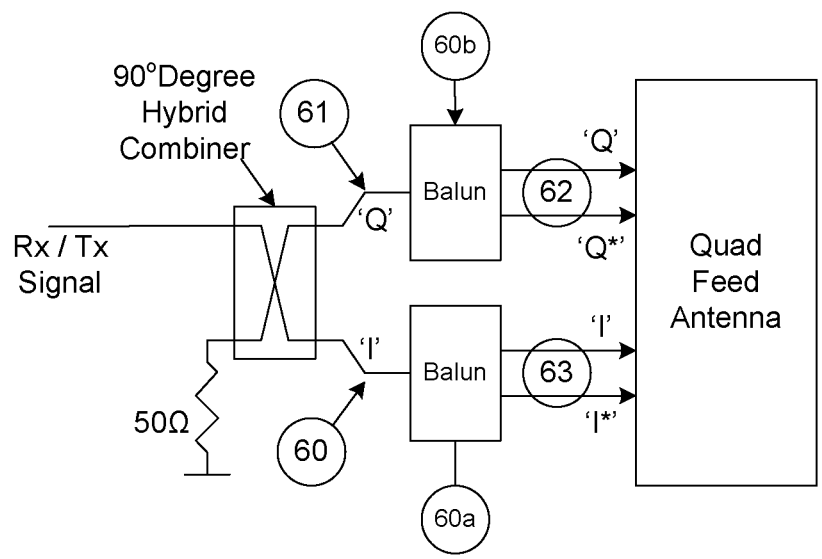
FIG. 15 shows an interface circuit for a quad feed capacitively coupled patch antenna.

FIG. 15 is a block diagram of a combining feed circuit wherein a single unbalanced input (or output for a transmitting antenna) is transformed to a pair of balanced feed signals in phase quadrature. Referring to FIG. 15, a 90 degree hybrid combiner (59) is first used to derive a first in-phase signal (I) (60) and a second phase-quadrature signal (Q) (61). Each one of I and Q is input to one of two matched baluns (61(a)) and (61(b)) each of which derive antipodal feed pairs. These are designated I and I* to drive the A feed pair of the antenna (63) and Q and Q* to drive the B feed pair (64) of the quad feed antenna. A balun is a well-known circuit block having a bi-directional transfer function that converts a single ended signal to an antipodal signal pair.

Figure 16:
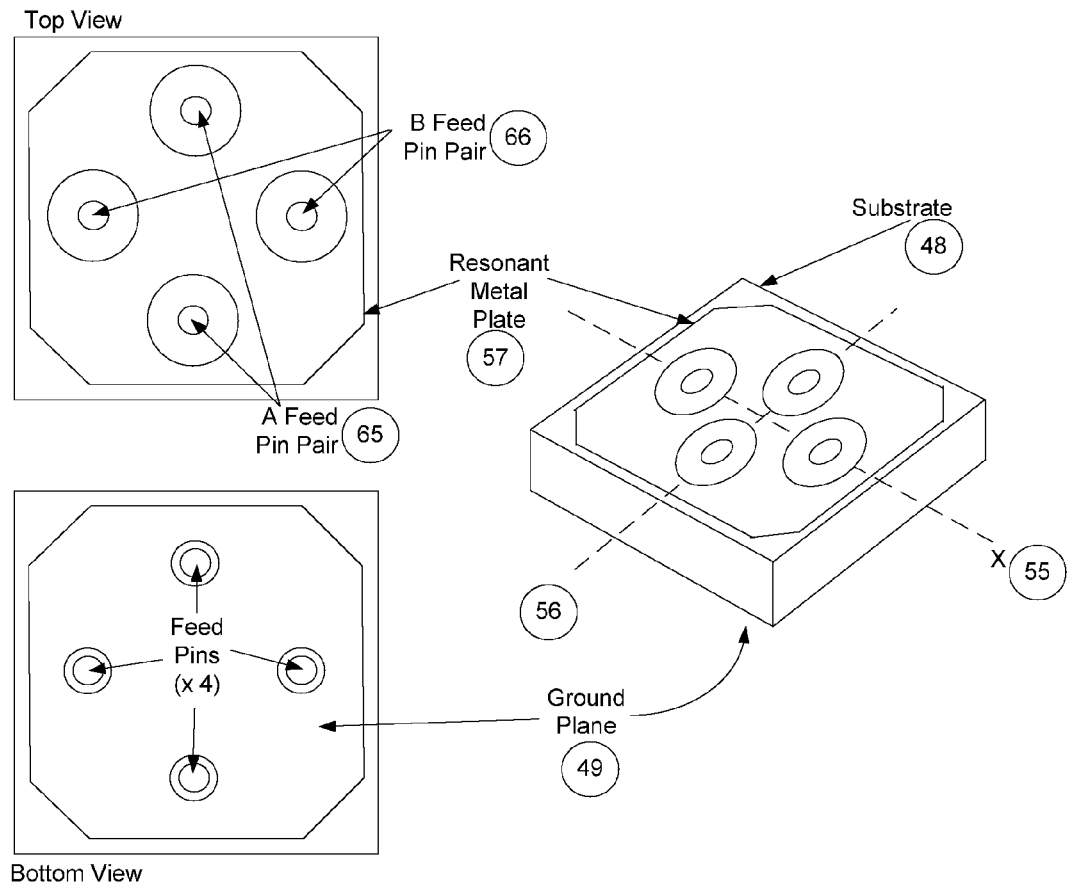
FIG. 16 shows a quad feed capacitively coupled patch antenna.

FIG. 16 shows the configuration of a quad feed capacitively coupled patch, similar to that of FIG. 13 or FIG. 14, except that the additional balancing voids are replaced with antipodal feed pins, each of which is also unconnected to the ground plane and the resonant metal plate. Each of the A feed pins (65) are disposed diametrically opposed relative to the patch center. The B feeds (66) are similarly disposed, but rotated 90 degrees, in the plane of the metal plate. The capacitively coupled feed pairs are driven in phase quadrature and the signals on each pair are antipodal.

In each case, it is necessary to combine the signals present at the antenna feeds in phase quadrature to achieve a circularly polarized response from the antenna.

The present invention also has a number of embodiments relating to the circuit aspect of the invention.

One embodiment of the invention is a circuit comprised of discrete resistors, capacitors, inductors and amplifiers arrayed in an arrangement that comprises a circuit with a first in-phase input port and a second phase-quadrature input port and an output port. The circuit has a first property of having a high degree of reverse electrical isolation between the input ports at radio frequency and the output. The circuit also has a second property of presenting at the output port a linear signal equal to the vector sum of the signal presented at the first input port and the signal presented at the second input port in phase quadrature.

Another embodiment of the invention is a circuit comprised of discrete resistors, capacitors, inductors and amplifiers arrayed in an arrangement that forms a circuit with a first in-phase input port and a second phase-quadrature input port and an output port. The circuit has a first property of having a high degree of reverse electrical isolation between the input ports at radio frequency and the output. The circuit also has a second property of presenting at the output port a linear signal equal to the vector sum of the signal presented at the first input port and the signal presented at the second input port in phase quadrature. The inputs are connected to the feed terminals of a dual feed patch antenna so as to realize a circularly polarized receive antenna.

Yet another embodiment of the invention provides a circuit comprised of discrete resistors, capacitors, inductors and amplifiers arrayed in an arrangement that comprises a circuit with a first in-phase input port and a second phase-quadrature input port and an output port. The circuit has a first property of having a high degree of reverse electrical isolation between the input ports at radio frequency and the output. The circuit also has a second property of presenting at the output port a linear signal equal to the vector sum of the signal presented at the first input port and the signal presented at the second input port in phase quadrature. The circuit has electrical properties that fully replicate the defined characteristics of a uni-directional 90 degree hybrid combiner.

Another embodiment of the invention is a circuit comprised of discrete resistors, capacitors, inductors and amplifiers arrayed in an arrangement that results in a circuit with an input port and a first in-phase output port and a second phase quadrature output port. The resulting circuit has a first property of having a high degree of electrical reverse isolation between the input port and each of the output ports at radio frequency. The circuit also has a second property of having a capability to split a signal present at the input into a first in-phase signal and a second phase quadrature signal each signal being of equal amplitude. The circuit also has electrical properties that entirely replicate the defined characteristics of a uni-directional 90 degree hybrid. The circuit may be used as a power splitter such as is required for a circularly polarized transmitting antenna.

The discrete component combiner aspect of the present invention combines the feed signals present at the feed terminals of a dual feed patch antenna, and more generally, combines the feed signals at the terminals of two orthogonal linearly polarized antennas.

Figures 5A, 5B:
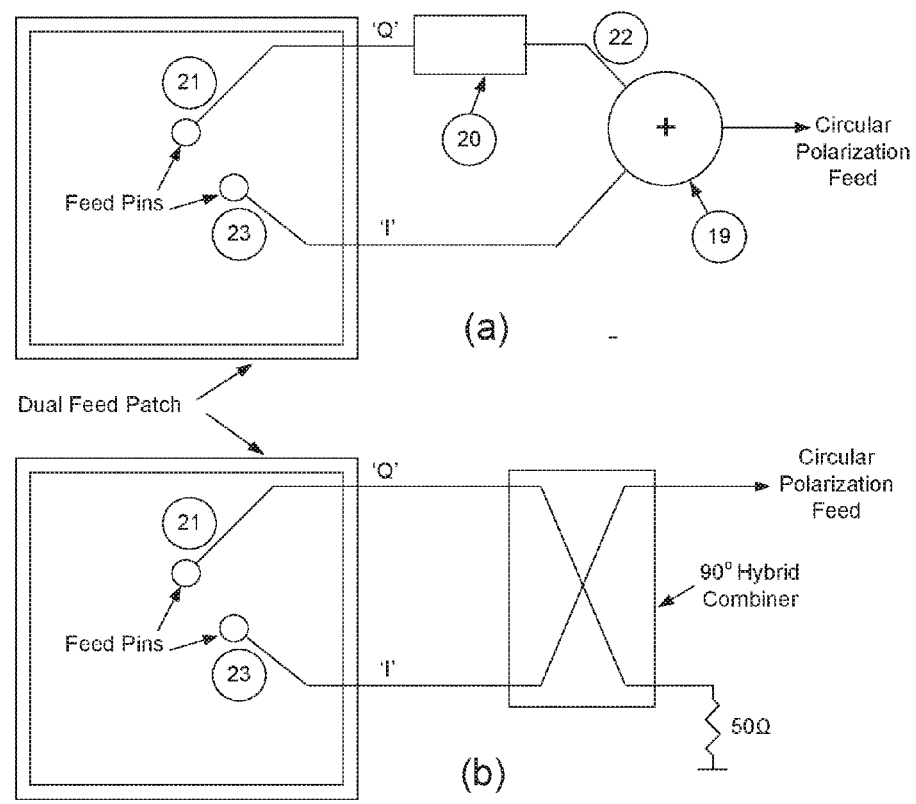
FIGS. 5(a) and 5(b) illustrate two forms of feed combination circuit for circularly polarized dual feed antennas.
Figure 6:
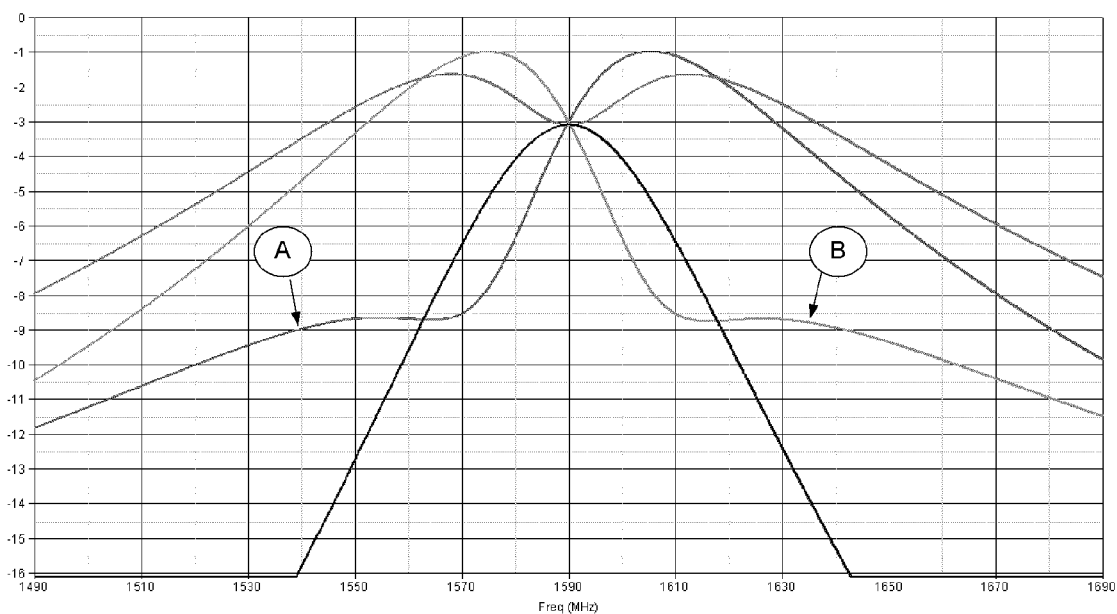
FIG. 6 illustrates the axial ratio response of a single feed patch antenna (single feed patch frequency response vs. LP rotation angle)

Unlike the combiner networks shown in FIGS. 5(a) and 5(b), the discrete component combiner is not bi-directional because the isolation between the input ports is realized by means of uni-directional amplifiers. A 90 degree power splitter can be realized with a similar but re-configured variant of this circuit, and may be used with advantage to provide the drive signals for a circularly polarized transmitting antenna.

It is preferred that the summing network for a circularly polarized antenna, comprised of two orthogonal linearly polarized antennas, provide a high degree of electrical isolation between the antenna feeds at the radio frequency. Otherwise, signals received on a first antenna feed will be re-radiated by the second.

Figure 17:
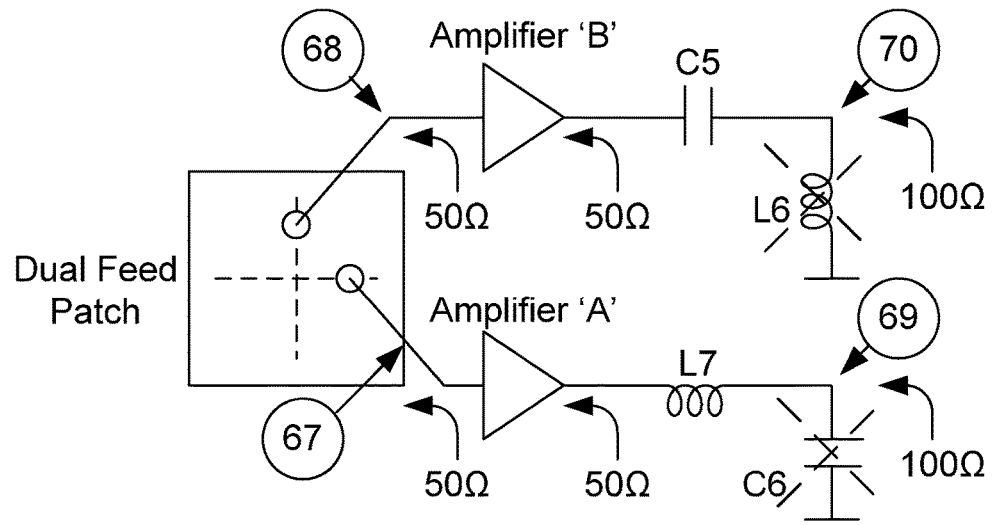
FIG. 17 shows isolation of the antenna feeds by means of uni-directional Low Noise Amplifiers with +/−45 degree phase shifting networks.

The discrete combining circuit can more easily be understood as a progressive synthesis. With reference to FIG. 17, antenna feed A (67) and antenna feed B (68) are connected to the corresponding inputs of two amplifiers that are matched with respect to input impedance ($Z_{IN1}$), output impedance ($Z_{IN2}$=50+0 j Ohms), gain ($S_{21}$), and group delay (phase shift). The matched amplifiers are further characterized by high reverse isolation ($S_{12}$).

A pair of L-match networks (C5, L6 and L7, C6)) are present at the output of each amplifier to transform the impedance of each from 50+0 j Ohms to 100+0 j Ohms. The L-match in path A (69) is a low pass network (shunt C, series L) and the L match in path B (70) is a high pass network (shunt L, series C)

The 'Q' of the transforming network is equal to 2, and the net difference between the phase shift introduced by each of the L-match networks is 90 degrees.

By combining the outputs of the 100 Ohm transforming networks together in a single combining node, an output impedance of 50 Ohms is obtained, but, this is only true for signals that are present on the amplifier inputs in phase quadrature with the correct phase quadrature polarity.

Because L-match A and L-match B have the same transformation ratio, the reactances of the shunt matching components are equal, but opposite in polarity (i.e. that of L6 and C6) and thus cancel, and can be eliminated from the circuit.

Figure 18:
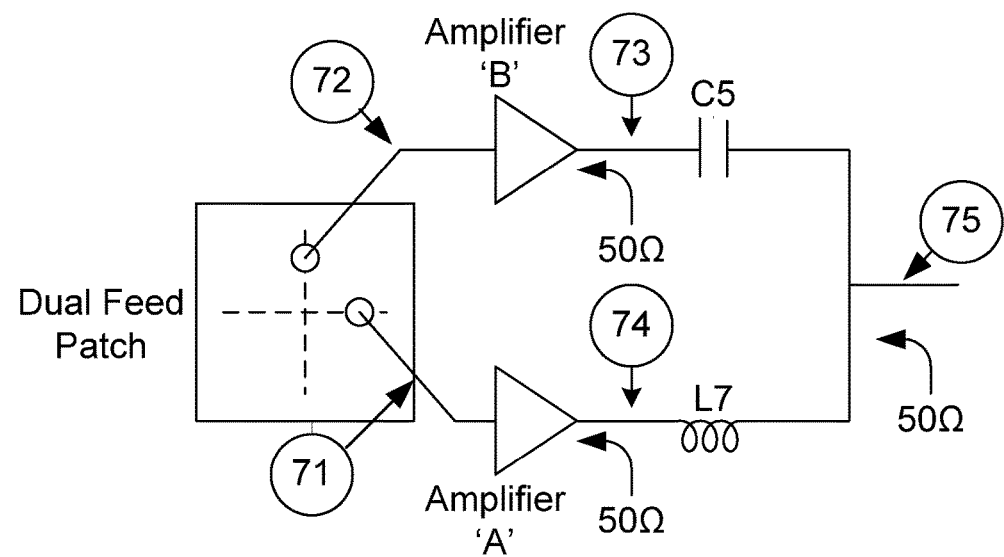
FIG. 18 illustrates the final form of a discrete component quadrature combiner according to one aspect of the invention.

The resulting final circuit, shown in FIG. 18, is comprised of matched amplifiers A and B with inputs (71) and (72), respectively, connected to antenna feed A and antenna feed B respectively. Inductor L7 is connected in series between the amplifier A output (72) and the combiner output node (73), and Capacitor C5 is connected in series between the amplifier B output (73) and the combiner output node.

The disposition of series inductance L7 and series capacitor C5 relative to amplifiers A and B determine the relative phase shift of amplifiers A and B which then determines that the combining circuit will support RHCP (and reject LHCP) or LHCP (and reject RHCP) signals.

The impedance of the combiner output node is well defined with the chosen impedances, nominally 50 ohms. The combining network provides the exact equivalent transfer function as that of a uni-directional 90 degree hybrid coupler, as is required to sum the signals present at the antenna feeds so as to obtain a circularly polarized response.

A person understanding this invention may now conceive of alternative structures and embodiments or variations of the above all of which are intended to fall within the scope of the invention as defined in the claims that follow.

We claim:

1. A patch antenna element comprising,
a resonant metal plate;
a ground plate;
a dielectric substrate sandwiched between said resonant metal plate and said ground plate;
at least two feed pins capacitively coupled to said resonant metal plate;
wherein
said element is at least a dual feed antenna element;
each of said at least two feed pins is located in said substrate;
each of said at least two feed pins has a first end which protrudes through a hole in said ground plane, said at least two feed pins being physically unconnected to said ground plane;
said at least two feed pins are for electrically coupling said patch antenna element for reception and transmission of a signal;
said feed pins being disposed such that each of two lines drawn between a center of said resonant metal plate and said feed pins comprise orthogonal axes;
each of said at least two feed pins is coupled across said dielectric substrate to said resonant metal plate by a capacitive reactance;
each of said at least two feed pins has a second end that protrudes through a hole in said resonant metal plate and is located within an area bounded by said resonant metal plate, said second end being physically isolated such that said second end is devoid of any physical connections, said second end being substantially co-planar with said resonant metal plate;
none of said at least two feed pins is directly physically connected to said resonant metal plate;
each of said at least two feed pins is offset from said center of the resonant metal plate by an offset distance;
a patch impedance for each of said at least two feed pins is determined by said offset distance and said capacitive reactance;
for a given offset distance, said patch impedance is lower when compared to an impedance for a feed pin which is directly physically coupled to said resonant metal plate.

2. A patch antenna element according to claim 1 wherein said second end of each of said at least two feed pins is coupled to a corresponding metal island on a side of said substrate containing said resonant metal plate, each metal island being physically isolated such that each metal island is physically unconnected to said resonant metal plate.

3. A patch antenna element according to claim 1 wherein each of said at least two feed pins is placed in said substrate and is located beneath said resonant metal plate, said resonant metal plate directly across from said feed pins being devoid of voids.

4. A patch antenna element according to claim 1 wherein each of said at least two pins are offset by equal distances from a center of said patch antenna element.

5. A patch antenna element according to claim 1 wherein said at least two feed pins comprises at least one pair of feed pins.

6. A patch antenna element according to claim 5 wherein for each pair of feed pins, each feed pin is offset by an equal distance from a center of said patch antenna element.

7. A patch antenna element according to claim 6 wherein for each pair of feed pins, a line between a first feed pin and said center of said patch antenna element is at right angles to a line between a second feed pin and said center of said patch antenna element.

8. A patch antenna element according to claim 1 wherein said resonant metal plate is square shaped.

9. A patch antenna element according to claim 1 wherein said resonant metal plate is octagon shaped.

10. A patch antenna element according to claim 1 wherein each of said at least two feed pins has a length which is less than a thickness of said substrate.

11. A patch antenna element according to claim 5 wherein each pair of feed pins is balanced by balancing voids in said resonant metal plate.

12. A patch antenna element comprising,
a resonant metal plate;
a ground plate;
a dielectric substrate sandwiched between said resonant metal plate and said ground plate;
a resonant cavity formed between said resonant plate and said ground plate;
plurality of pairs of feed pins for electrically coupling said antenna element for reception and transmission of a signal such that said element is at least a dual feed antenna element;
wherein
each one of said plurality of pairs of feed pins is located in said substrate;
each one of said plurality of pairs of feed pins has a first end which protrudes through a hole in said ground plate, said plurality of pairs of feed pins being physically unconnected to said ground plate;
each one of said plurality of pairs of feed pins has a second end that protrudes through a hole in said resonant metal plate and is located within an area bounded by said resonant metal plate, said second end being physically isolated such that said second end is devoid of any physically connections, said second end being substantially co-planar with said resonant metal plate;
each one of said plurality of pairs of feed pins being disposed such that each of two lines drawn between a center of said resonant metal plate and said pair of feed pins comprise orthogonal axes;
each one of said plurality of pairs of two feed pins is coupled across said dielectric substrate to said resonant metal plate by a capacitive reactance;
each one of said plurality of pairs of feed pins is offset from said center of the resonant metal plate by an offset distance;
a patch impedance for each one of said plurality of pairs of feed pins is determined by said offset distance and said capacitive reactance;
for a given offset distance, said patch impedance is lower when compared to an impedance for a feed pin which is directly physically coupled to said resonant metal plate.

13. A patch antenna element according to claim 12 wherein said second end of each feed pin of said plurality of pairs of feed pins is coupled to a corresponding metal island on a side of said substrate containing said resonant metal plate, each metal island each metal island being physically isolated such that each metal island is physically unconnected to said resonant metal plate.

14. A patch antenna element according to claim 12 wherein for each pair of feed pins, each feed pin is offset by an equal distance from a center of said patch antenna element.

15. A patch antenna element according to claim 14 wherein for each pair of feed pins, a line between a first feed pin and said center of said patch antenna element is at right angles to a line between a second feed pin and said center of said patch antenna element.

* * * * *